(12) United States Patent
Yamashita

(10) Patent No.: US 10,204,950 B1
(45) Date of Patent: Feb. 12, 2019

(54) SPAD IMAGE SENSOR AND ASSOCIATED FABRICATING METHOD

(71) Applicant: TAIWAN SEMICONDUCTOR MANUFACTURING COMPANY LTD., Hsinchu (TW)

(72) Inventor: Yuichiro Yamashita, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 15/872,712

(22) Filed: Jan. 16, 2018

Related U.S. Application Data

(60) Provisional application No. 62/566,138, filed on Sep. 29, 2017.

(51) Int. Cl.
- *H01L 31/113* (2006.01)
- *H01L 27/146* (2006.01)
- *H01L 31/107* (2006.01)

(52) U.S. Cl.
CPC ...... *H01L 27/1463* (2013.01); *H01L 27/1462* (2013.01); *H01L 27/1464* (2013.01); *H01L 27/1469* (2013.01); *H01L 27/14621* (2013.01); *H01L 27/14627* (2013.01); *H01L 27/14634* (2013.01); *H01L 27/14636* (2013.01); *H01L 27/14645* (2013.01); *H01L 27/14689* (2013.01); *H01L 31/107* (2013.01)

(58) Field of Classification Search
None
See application file for complete search history.

(56) References Cited

U.S. PATENT DOCUMENTS

2012/0205730 A1* 8/2012 Chen ................. H01L 27/14609
257/292

OTHER PUBLICATIONS

Matteo Perenzoni et al., Compact SPAD-Based Pixel Architectures for Time-Resolved Image Sensors, Sensors 2016, 16, 745.

* cited by examiner

*Primary Examiner* — Fernando L Toledo
*Assistant Examiner* — Lawrence-Lin T Nguyen
(74) *Attorney, Agent, or Firm* — WPAT, P.C., Intellectual Property Attorneys; Anthony King

(57) ABSTRACT

A single photon avalanche diode (SPAD) image sensor is disclosed. The SPAD image sensor includes: a substrate having a front surface and a back surface; a trench isolation in the substrate, the trench isolation extending from the front surface of the substrate toward the back surface of the substrate, the trench isolation having a first surface and a second surface opposite to the first surface, the first surface being coplanar with the front surface of the substrate, the second surface being distanced from the back surface of the substrate by a distance greater than 0; wherein the substrate includes: a first layer doped with dopants of a first conductivity type, the first layer extending from the back surface of the substrate toward the trench isolation and laterally surrounding at least a portion of sidewalls of the trench isolation.

20 Claims, 11 Drawing Sheets

SPAD IMAGE SENSOR AND ASSOCIATED FABRICATING METHOD

CROSS REFERENCE TO RELATED APPLICATIONS

This application claims the benefit of U.S. provisional application 62/566,138, filed on Sep. 29, 2017, which is incorporated by reference in its entirety.

BACKGROUND

Digital cameras and optical imaging devices employ image sensors. Image sensors convert optical images to digital data that may be represented as digital images. An image sensor typically includes an array of pixel sensors, which are unit devices for the conversion of an optical image into electrical signals. Pixel sensors often manifest as charge-coupled devices (CCDs) or complementary metal oxide semiconductor (CMOS) devices.

Avalanche photodiodes (APD) are solid devices that are compatible with traditional CMOS devices. An avalanche process can be triggered when a reverse biased p-n junction receives additional carriers, such as carriers generated by incident radiation. For example, in order to detect radiations with low intensities, the p-n junction is biased above its breakdown voltage, thereby allowing a single photon-generated carrier to trigger an avalanche current that can be detected. Image sensor operated in this mode is known as a single photon avalanche diode (SPAD) image sensor, or a Geiger-mode avalanche photodiodes or G-APD.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
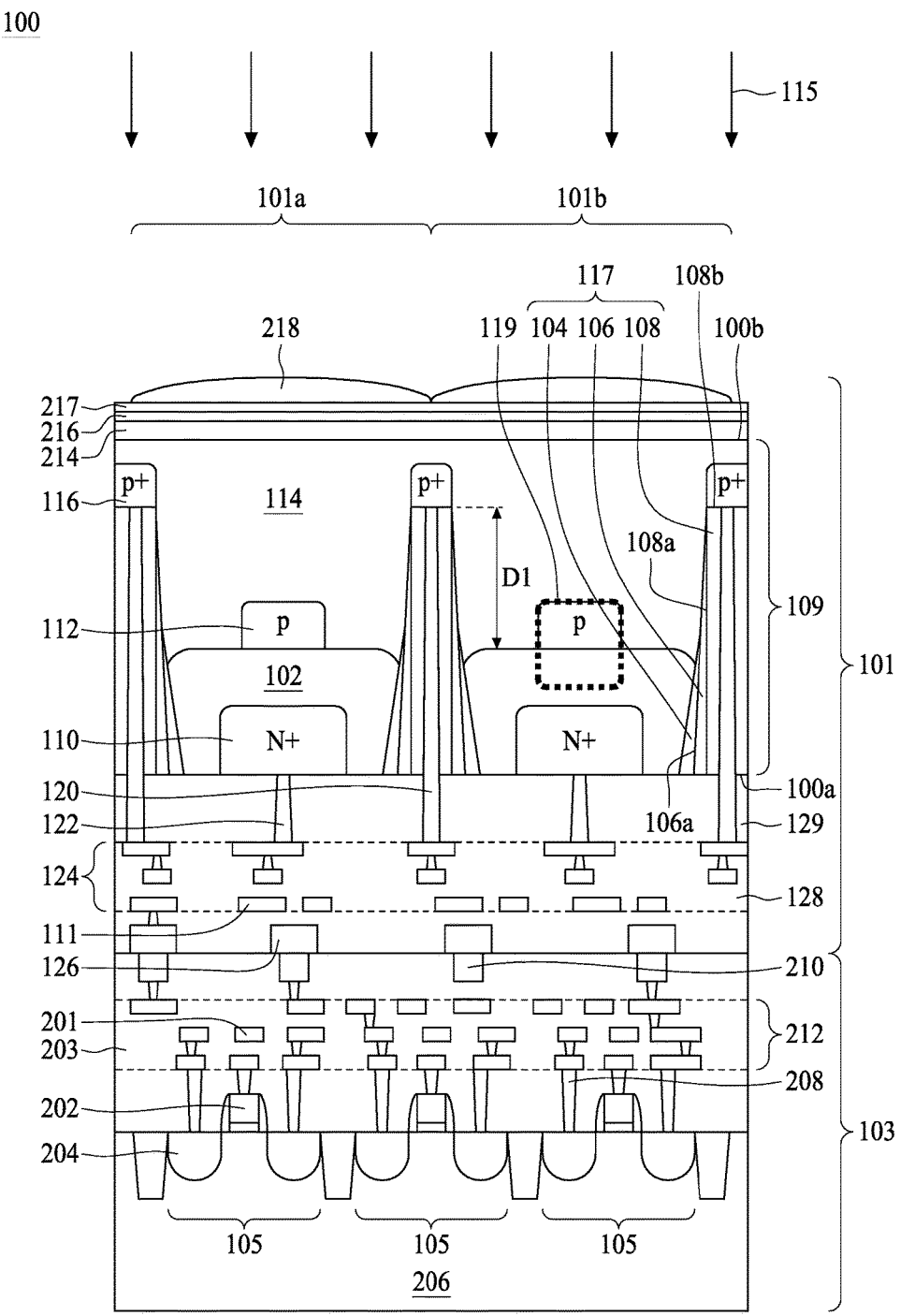
FIG. 1 is a diagram illustrating a cross-sectional view of a SPAD image sensor including a CMOS (complementary metal-oxide-semiconductor) chip and an imaging chip bonded together in accordance with a first embodiment of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

A SPAD (single photon avalanche diode) image sensor can detect incident radiation with very low intensities (e.g., a single photon). The SPAD image sensor includes a plurality of SPAD cells arranged in an array. The SPAD cells respectively include a p-n junction, a quench circuit and a read circuit. The p-n junction operates at a reverse bias well above its breakdown voltage. During operation, photo-generated carriers move to a depletion region (i.e., a multiplication region) of the p-n junction and trigger an avalanche effect such that a signal current can be detected. The quench circuit is used to cut off the avalanche effect and reset the SPAD cell. The read circuit receives and transmits the signal current.

An existing planar SPAD image sensor is configured to include a guard ring between a sensing node and a common node. Without the guard ring to relax the electric field in the vicinity between the sensing node and the common node, an edge breakdown may occur before a breakdown occurs at a photodetective portion. If the edge breakdown occurs first, it is not possible to sufficiently raise the electric field intensity at the photodetective portion because the increase in voltage only causes current to flow. In particular, if an edge breakdown occurs at a voltage lower than the breakdown voltage at the photodetective portion, a sufficient multiplication factor cannot be obtained at the photodetective portion because the electric field intensity at the photodetective portion cannot be raised sufficiently and sufficiently high photodetective sensitivity cannot be ensured, therefore, it is not possible to sufficiently function as a SPAD as a result. Further, if an edge breakdown has occurred, excessive noises are caused to occur as a result, and this also raises a problem.

However, the guard ring consumes a large area and therefore limits the fill factor, a parameter characterizing a ratio of photodiode area to total pixel area. As a result, shrinking a pixel area and keeping performance is hard to be achieved for existing SPAD image sensors. The present disclosure relates to a SPAD image sensor consumes a smaller area without sacrificing performance compared to the existing SPAD image sensor.

FIG. 1 is a diagram illustrating a cross-sectional view of a SPAD image sensor 100 including a CMOS (complementary metal-oxide-semiconductor) chip 103 and an imaging chip 101 bonded together in accordance with a first embodiment of the present disclosure. The SPAD image sensor 100 includes an array of pixels 101a to 101b as shown in FIG. 1 for illustrative purpose. For many instances, the SPAD image sensor 100 may include more than two pixels. The CMOS chip 103 has a plurality of active devices 105. In some embodiments, the CMOS chip 103 includes an interconnect structure 212 disposed over a substrate 206. In some embodiments, the interconnect structure 212 includes a plurality of metal layers 201 disposed within an inter-layer dielectric (ILD) layer 203. The active devices 105 are disposed at least in the substrate 206. The imaging chip 101 includes an interconnect structure 124 disposed between the interconnect structure 212 of the CMOS chip 103 and a substrate 109 of the imaging chip 101. The interconnect structure 124 includes a plurality of metal layers 111 disposed within an ILD layer 128.

Each of the pixels 101a and 101b includes a SPAD cell disposed within the substrate 109. The substrate 109 includes a front surface 100a facing the interconnect structure 124 and a back surface 100b facing opposite to the interconnect structure 124. A dielectric layer 129 is between the substrate 109 and the interconnect structure 124. Each two adjacent SPAD cells are separated by a trench isolation 117. In some embodiments, the trench isolation 117 may include a main structure 108 extending from the front surface 100a toward the back surface 100b. The main structure 108 may have an elongated rectangular profile. A first surface of the main structure 108 is coplanar with the front surface 100a, and a second surface 108b of the main structure 108 is in the substrate 109 and does not in contact with or overlap the back surface 100b. For many instances, the trench isolation 117 may optionally include an inner spacer 106 and an outer spacer 104.

The inner spacer 106 may have an elongated right triangular profile extending from the front surface 100a toward the back surface 100b along a sidewall 108a of the main structure 108. The elongated right triangular profile of the inner spacer 106 includes a hypotenuse, a first leg, and a second leg longer than the first leg. The first leg of the inner spacer 106 is coplanar with the front surface 100a and the second leg of the inner spacer 106 immediately abuts the sidewall 108a of the trench isolation 117. The second leg of the inner spacer 106 may have a length the same to the sidewall 108a of the trench isolation 117. In this way, the inner spacer 106 is able to fully cover the sidewall 108a of the trench isolation 117 and the sidewall 108a does not directly in contact with the substrate 109.

The outer spacer 104 may have an elongated triangular profile extending from the front surface 100a toward the back surface 100b along a sidewall 106a of the inner spacer 106. The elongated triangular profile of the outer spacer 104 includes a hypotenuse, a first leg, and a second leg longer than the first leg. The first leg of the outer spacer 104 is coplanar with the front surface 100a, and the second leg of the outer spacer 104 immediately abuts the hypotenuse of the inner spacer 106. A length of the second leg of the outer spacer 104 may be shorter than a length of the hypotenuse of the inner spacer 106. In this way, outer spacer 104 may only cover a portion of the hypotenuse of the outer inner spacer 106, and a portion of the hypotenuse of the inner spacer 106 not covered by the outer spacer 104 may be directly in contact with the substrate 109.

The trench isolation 117 may be formed of a dielectric material such as an oxide (silicon oxide, for example), a nitride (silicon nitride or silicon oxynitride, for example), a low-k dielectric, and/or another suitable dielectric material.

The substrate 109 may include a first layer 114 doped with dopants of a first conductivity type, e.g., p type. A dopant concentration of the first layer 114 of the first conductivity type may be at a level of about $1e16/cm^3$. The first layer 114 extends from the back surface 100b of the substrate 109 toward the trench isolation 117 and encompasses at least a portion of the trench isolation 117 neighboring to the back surface 100b. The substrate 109 may further include a second layer 102 in each of the pixels 101a and 101b. The second layer 102 may be doped with dopants of a second conductivity type, e.g., n type, opposite to the conductivity type of the first layer 114. A dopant concentration of the second layer 102 may be at a level of about $1e17/cm^3$ to about $1e19/cm^3$. The second layer 102 is between the first layer 114 and the front surface 100a of the substrate 109. In particular, the second layer 102 immediately abuts the front surface 100a of the substrate 109 and the trench isolation 117. For many instances, the second layer 102 of the pixels 101a is separated from the second layer 102 of the pixels 101b by the trench isolation 117, and the second layer 102 of the pixels 101a is not in contact with the second layer 102 of the pixels 101b. In some embodiments, the second layer 102 may be omitted, i.e. replaced by the first layer 114.

Each of the pixels 101a and 101b further includes a sensing node 110 heavily doped with dopants of the second conductivity type, e.g., n type, the same to the conductivity type of the second layer 102. A dopant concentration of the sensing node 110 may be heavier than the dopant concentration of the second layer 102. In some embodiments, a ratio of the dopant concentration of the sensing node 110 to the dopant concentration of the second layer 102 may be in a range from about 10 to about 1000. In an embodiment, the dopant concentration of the sensing node 110 may be at a level of about $1e20/cm^3$. The sensing node 110 is formed in the substrate 109 and immediately abuts the front surface 100a of the substrate 109. In particular, the sensing node 110 is formed within the second layer 102 and is encompassed by the second layer 102. In other words, the sensing node 110 is separated from the first layer 114 by the second layer 102. Through a contact plug 122, the sensing node 110 is able to be coupled to the active devices 105 of the CMOS chip 103 via the interconnect structure 124 and the ILD layer 203. In some embodiments, the active devices 105 may include active quench circuit to stop avalanche effect and reset bias of the SPAD cells. The active devices 105 may also include read circuit and other control or logic circuits. For example, the active devices 105 may include a transistor device having a gate structure 202 and source/drain regions 204. The sensing node 110 can be coupled to a source/drain region 204 of the transistor through a contact plug 208.

Each of the pixels 101a and 101b may further includes a third layer 112 doped with dopants of the first conductivity type, e.g., p type, the same to the conductivity type of the first layer 114. A dopant concentration of the third layer 112 may be heavier than the dopant concentration of the first layer 114. In some embodiments, a ratio of the dopant concentration of the third layer 112 to the dopant concentration of the first layer 114 may be in a range from about 1 to about 100. In an embodiment, the dopant concentration of the third layer 112 may be at a level of about 1e17/cm$^3$. The third layer 112 is formed in the first layer 114 and immediately abuts the second layer 102. In particular, the third layer 112 is formed within the first layer 114 and is encompassed by the first layer 114. In particular, the third layer 112 is separated from the sensing node 110 by the second layer 102.

A common node 116 is neighboring to the second surface 108b of each of the trench isolations 117. For many instances, the common node 116 immediately abuts the second surface 108b of each of the trench isolations 117. The common node 116 is heavily doped with dopants of the first conductivity type, e.g., p type, the same to the conductivity type of the first layer 114 and the third layer 112. A dopant concentration of the common node 116 may be heavier than the dopant concentration of the first layer 114 and the third layer 112. In some embodiments, a ratio of the dopant concentration of the common node 116 to the dopant concentration of the third layer 112 may be in a range from about 10 to about 1000. In an embodiment, the dopant concentration of the common node 116 may be at a level of about 1e20/cm$^3$. The common node 116 is formed within the first layer 114 and is encompassed by the first layer 114. In particular, the common node 116 is separated from second layer 102 by a distance D1 with respect to a vertical direction perpendicular to a direction of the front surface or the back surface of the substrate. In some embodiments, the distance D1 may be in a range from about 0.5 um to about 1 um. Through a contact plug 120, the common node 116 is able to be coupled to the active devices 105 of the CMOS chip 103 via the interconnect structure 124 and the ILD layer 203.

According to various embodiments of the present disclosure, a desired breakdown region 119 is depicted in FIG. 1 around an interface of the third layer 112 and the second layer 102. Since a distance between the third layer 112 and the second layer 102 is shorter than the vertical distance D1 between the common node 116 and the second layer 102, an edge breakdown is less likely to happen compared to the breakdown occurring at the desired breakdown region 119. In other words, the vertical distance D1 between the common node 116 and the second layer 102 is able to replace a function of the guard ring of the existing SPAD cells. By adjusting the position of the common node 116 from the front surface 100a of the substrate 109 to deep inside the substrate 109, the guard ring originally at the front surface 100a and between the sensing node 110 and the common node 116 can be saved. Thus the fill factor of the present disclosure can be improved. When the breakdown successfully happens at the breakdown region 119, holes flow to the sensing node 110 and are collected by the sensing node 110, and electrons are absorbed by the common node 116. In an embodiment, each of the common nodes 116 and the contact plugs 120 is shared by neighboring SPAD cells.

In some embodiments, the imaging chip 101 and the CMOS chip 103 are bonded together by a hybrid bond including a metal-to-metal bond and a dielectric-to-dielectric bond. The metal to metal bond (e.g. a diffusion bond) can be between a top metal layer 126 of the plurality of metal layers 111 and a top metal layer 210 of the plurality of metal layers 201. The dielectric-to-dielectric bond can be between the ILD layer 128 and the ILD layer 203 such that the ILD layer 128 and the ILD layer 203 are in direct contact with one another. The top metal layers 126 and 210 function as a pair of bonding pads and can include re-distribution layers (RDLs). In some embodiments, the dielectric-to-dielectric bond is an oxide-to-oxide bond.

In some embodiments, the imaging chip 101 may as well have a plurality of active devices in peripheral regions of the substrate 109 at around the array of pixels 101a to 101b. For instance, a portion or all of the active quench circuit, the read circuit and other control or logic circuits mentioned above may be disposed in the substrate 109 of the imaging chip 101 instead of the CMOS chip 103.

In some embodiments, the SPAD image sensor 100 further includes a high-k dielectric layer 214 and/or an anti-reflective coating (ARC) layer 216 disposed over the back surface 100b of the substrate 109, configured to facilitate transmissions of the incident photons 115 from the back surface 100b to the SPAD cells. The SPAD image sensor 100 may further include a color filter layer 217 over the ARC layer 216. For many instances, the color filter layer 217 contains a plurality of color filters positioned such that the incoming radiation is directed thereon and therethrough. The color filters includes a dye-based (or pigment based) polymer or resin for filtering a specific wavelength band of the incoming radiation, which corresponds to a color spectrum (e.g., red, green, and blue). A micro-lens layer 218 containing a plurality of micro-lenses is formed over the color filter layer 217. The micro-lenses 218 direct and focus the incoming radiation 115 toward the SPAD cells. The micro-lenses 218 may be positioned in various arrangements and have various shapes depending on a refractive index of a material used for the micro-lens 218 and distance from a sensor surface. For many instances, a center of each of the micro-lenses 218 overlaps a center of each of the corresponding SPAD cells from a top view.

Figure 2:
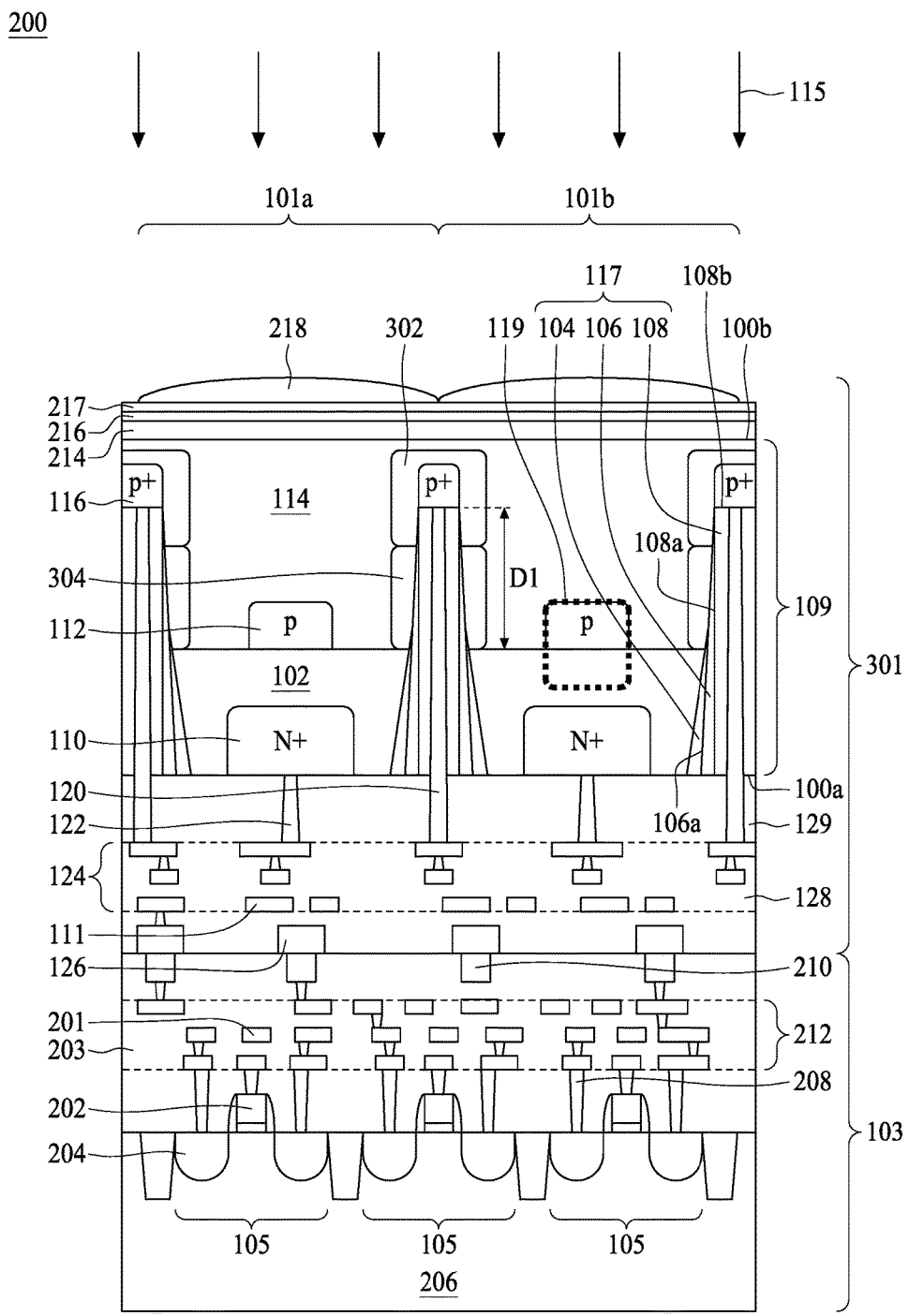
FIG. 2 is a diagram illustrating a cross-sectional view of a SPAD image sensor including the CMOS chip and an imaging chip bonded together in accordance with a second embodiment of the present disclosure.

FIG. 2 is a diagram illustrating a cross-sectional view of a SPAD image sensor 200 including the CMOS chip 103 and an imaging chip 301 bonded together in accordance with a second embodiment of the present disclosure. The imaging chip 301 is the same to the imaging chip 101 except the substrate 109 of the imaging chip 301 further includes a first block region 302 and/or a second block region 304.

The first block region 302 may be doped with dopants of the first conductivity type, e.g., p type, the same to the conductivity type of the common node 116. In some embodiments, a ratio of the dopant concentration of the common node 116 to a dopant concentration of the first block region 302 may be in a range from about 10 to about 100. For instances, the dopant concentration of the first block region 302 may be at a level of about 1e19/cm$^3$. The first block region 302 is within the first layer 114. In particular, the first block region 302 immediately abuts and encompasses the common node 116 and a portion of the trench isolations 117. For many instances, the first block region 302 does not extend to the back surface 100b and the second layer 102. The first block region 302 may be used as a guard ring for electric field relaxing to further prevent premature edge breakdown of the SPAD cells.

The second block region 304 may be doped with dopants of the second conductivity type, e.g., n type, the same to the conductivity type of the second layer 102. In some embodiments, a ratio of the dopant concentration of the second layer 102 to a dopant concentration of the second block region 304 may be in a range from about 10 to about 100. For instances, the dopant concentration of the second block region 304 may be at a level of about $1e16/cm^3$ to about $1e18/cm^3$. The second block region 304 is within the first layer 114. In particular, the second block region 304 immediately abuts and encompasses a portion of the trench isolation 117. For many instances, the second block region 304 is between the first block region 302 and the second layer 102. In some embodiments, the second block region 304 immediately abuts the first block region 302 and the second layer 102. Like the first block region 302, the second block region 304 may be used as a guard ring as well for electric field relaxing to further prevent premature edge breakdown of the SPAD cells.

Figure 3:
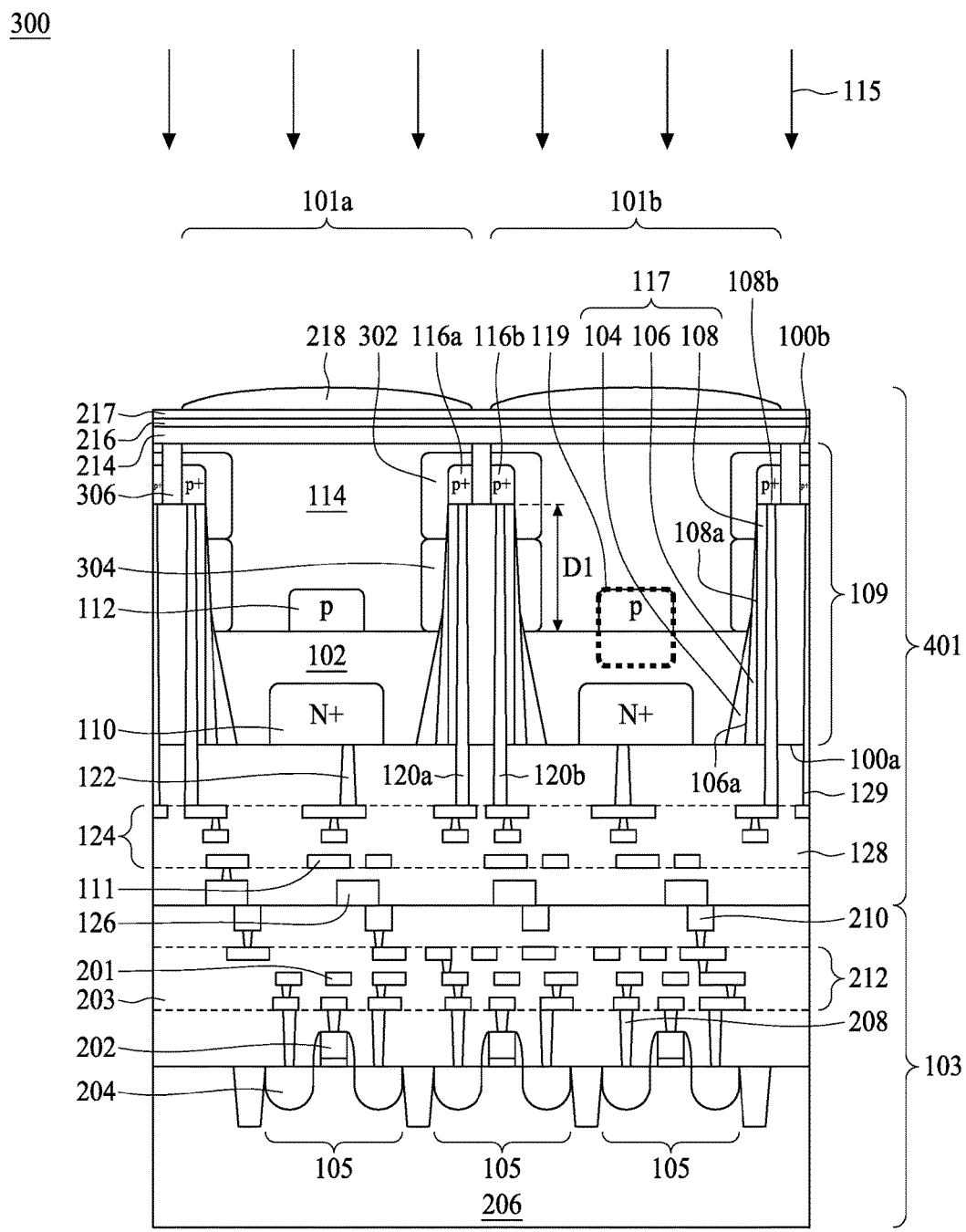
FIG. 3 is a diagram illustrating a cross-sectional view of a SPAD image sensor including the CMOS chip and an imaging chip bonded together in accordance with a third embodiment of the present disclosure.

FIG. 3 is a diagram illustrating a cross-sectional view of a SPAD image sensor 300 including the CMOS chip 103 and an imaging chip 401 bonded together in accordance with a third embodiment of the present disclosure. As mentioned above, the common nodes 116 and the contact plug 120 of the imaging chip 101 and the imaging chip 301 is shared by neighboring SPAD cells. An alternative configuration shows in the imaging chip 401, where the common nodes 116 of the imaging chip 101 and the imaging chip 301 is split into two common nodes 116a and 116b, and the contact plug 120 is split into two contact plugs 120a and 120b. The contact plugs 120a and 120b are coupled to the common node 116a and the common node 116b respectively. In particular, the trench isolation 117 may further include a isolator 306 between the common node 116a and the common node 116b. In some embodiments, the isolator 306 extends from the second surface 108b of the trench isolations 117 toward the back surface 100b and separates the first block region 302. In some embodiments, the isolator 306 is in contact with the back surface 100b for better prevent crosstalk between adjacent pixels. Like the other portions of the trench isolation 117, the isolator 306 may be formed of a dielectric material such as an oxide (silicon oxide, for example), a nitride (silicon nitride or silicon oxynitride, for example), a low-k dielectric, and/or another suitable dielectric material. For many instances, the first block region 302 and/or the second block region 304 may be optionally omitted in the SPAD image sensor 300.

Figure 4:
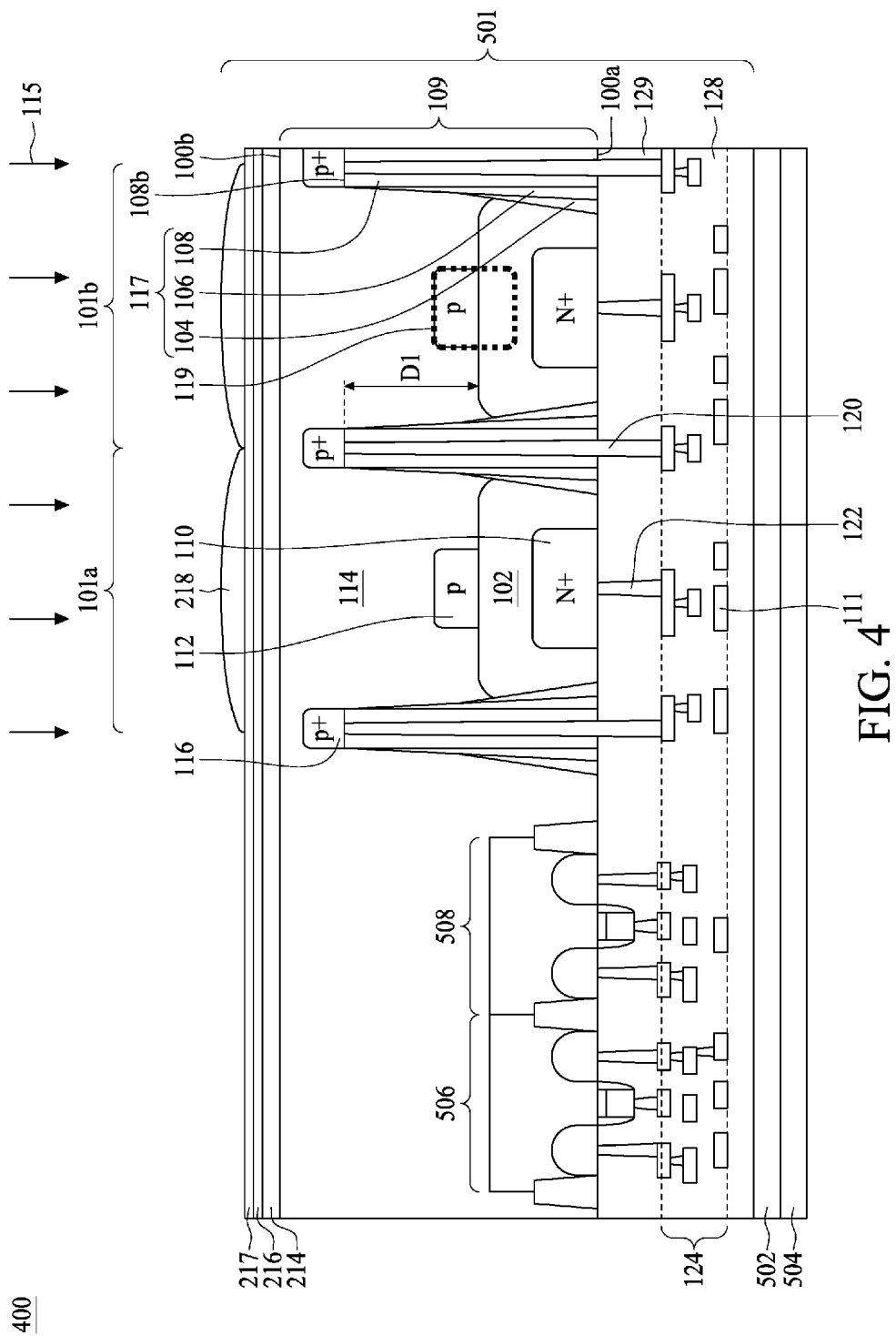
FIG. 4 is a diagram illustrating a cross-sectional view of a SPAD image sensor including an imaging chip in accordance with a fourth embodiment of the present disclosure.

As mentioned above, the imaging chip 101 may as well have a plurality of active devices in peripheral regions of the substrate 109 at around the array of pixels 101a to 101b. For instance, a portion or all of the active quench circuit, the read circuit and other control or logic circuits mentioned above may be disposed in the substrate 109 of the imaging chip 101 instead of the CMOS chip 103. For many instances, all of the active quench circuit, the read circuit and other control or logic circuits and the pixels are integrated in the same substrate and the CMOS chip 103 may be omitted. FIG. 4 is a diagram illustrating a cross-sectional view of a SPAD image sensor 400 including an imaging chip 501 in accordance with a fourth embodiment of the present disclosure. The imaging chip 501 is the same to the imaging chip 101 except the imaging chip 501 is bonded to a carrier substrate 504 through a buffer layer 502. The buffer layer 502 may include a dielectric material such as silicon oxide. Alternatively, the buffer layer 502 may optionally include silicon nitride.

The carrier substrate 504 may include a silicon material. Alternatively, the carrier substrate 504 may include a glass substrate or other suitable materials. The carrier substrate 504 may be bonded to the buffer layer 502 by molecular forces, i.e., a technique known as direct bonding or optical fusion bonding, or by other bonding techniques known in the art, such as metal diffusion or anodic bonding. The buffer layer 502 provides electrical isolation and protection for the various features formed on the front surface 100a of the substrate 109. The carrier substrate 504 also provides mechanical strength and support for processing the SPAD image sensor 400. In some embodiments, a plurality of active devices 506 and 508 may be integrated in the imaging chip 501. The active devices may be formed in the substrate 109 around the array of pixels 101a to 101b. For instance, the active devices 506 and 508 may include the active quench circuit, the read circuit and other control or logic circuits.

Figure 5:
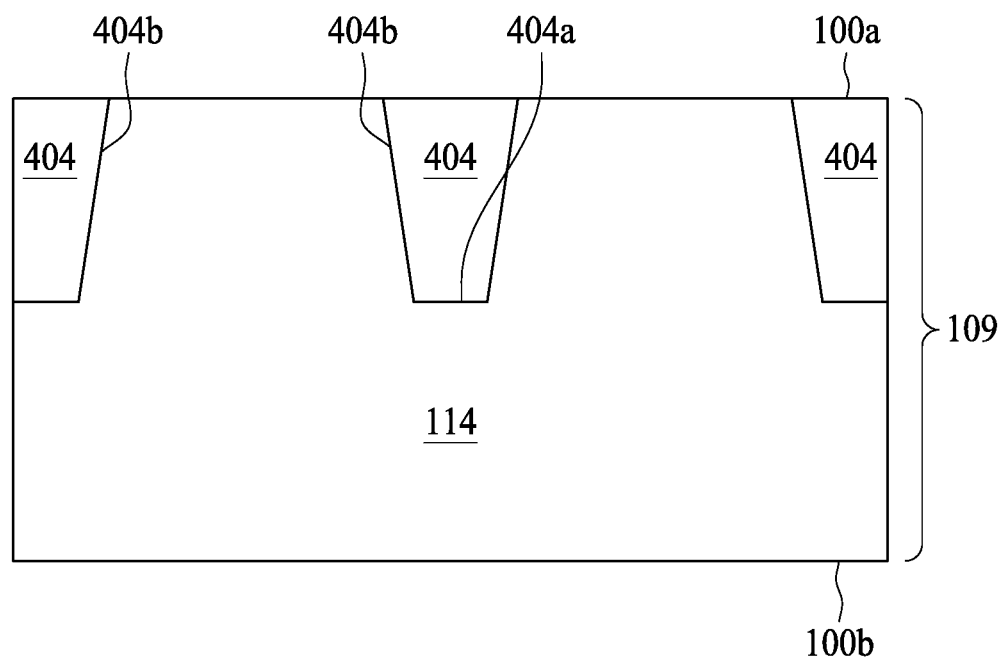
FIG. 5 to FIG. 11 are diagrams illustrating fragmentary cross-sectional views of the SPAD image sensor at various stages of fabrication in accordance with a preferred embodiment of the disclosure.

FIG. 5 to FIG. 11 are diagrams illustrating fragmentary cross-sectional views of the SPAD image sensor 200 at various stages of fabrication in accordance with a preferred embodiment of the disclosure. It is understood that FIG. 5 to FIG. 11 have been simplified for a better understanding of the inventive concepts of the present disclosure and may not be drawn to scale. With reference to FIG. 5, the substrate 109 is provided. The substrate 109 includes the first layer 114. The first layer 114 may be doped with dopants of the first conductivity type, and has the dopant concentration at a level of about $1e16/cm^3$. The first layer 114 extends from the front surface 100a to the back surface 100b of the substrate 109. Isolation structures 404 are formed in the first layer 114 and respectively has a rectangular shape, somewhat a trapezoidal shape, or another suitable shape. Each of the isolation structures 404 has a bottom surface 404a and sidewalls 404b.

Figure 6:
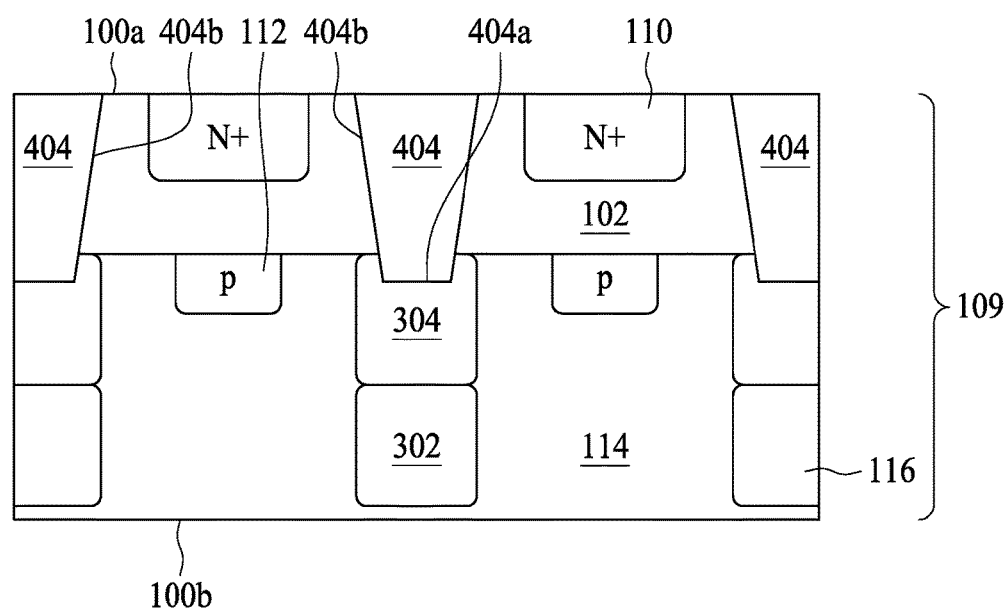

With reference to FIG. 6, an ion implantation may be performed upon the front surface 100a of the substrate 109 with dopants of the second conductivity type, for instance, the n type dopant, opposite to the conductivity type of the first layer 114 to form the second layer 102. The dopant concentration of the second layer 102 may be at a level of about $1e17/cm^3$ to about $1e19/cm^3$. The second layer 102 is between the isolation trenches 404. In particular, the second layer 102 extends from the front surface 100a of the substrate 109 toward the back surface 100b of the substrate 109, and not exceeding the bottom surface 404a of the isolation structures 404. In other words, the second layer 102 immediately abuts at least a portion of the sidewalls 404b of the isolation structures 404.

Subsequent to the second layer 102, the third layer 112 and the sensing node 110 may be formed by ion implantation as well. The third layer 112 may be doped with dopants of the first conductivity type, e.g., p type, the same to the conductivity type of the first layer 114. The dopant concentration of the third layer 112 may be heavier than the dopant concentration of the first layer 114. In some embodiments, a ratio of the dopant concentration of the third layer 112 to the dopant concentration of the first layer 114 may be in a range from about 1 to about 100. In an embodiment, the dopant concentration of the third layer 112 may be at a level of about 1e17/cm³. The third layer 112 is formed in the first layer 114 and immediately abuts the second layer 102. In particular, the third layer 112 is formed within the first layer 114 and is encompassed by the first layer 114. The sensing node 110a may be heavily doped with dopants of the second conductivity type, e.g., n type, the same to the conductivity type of the second layer 102. The dopant concentration of the sensing node 110 may be heavier than the dopant concentration of the second layer 102. In some embodiments, a ratio of the dopant concentration of the sensing node 110 to the dopant concentration of the second layer 102 may be in a range from about 10 to about 1000. In an embodiment, the dopant concentration of the sensing node 110 may be at a level of about 1e20/cm³. The sensing node 110 is formed in the substrate 109 and immediately abuts the front surface 100a of the substrate 109. In particular, the sensing node 110 is formed within the second layer 102 and is encompassed by the second layer 102.

In some embodiments, the first block region 302 and the second block region 304 may be formed by ion implantation. The first block region 302 may be doped with dopants of the first conductivity type, e.g., p type. In some embodiments, the dopant concentration of the first block region 302 may be at a level of about 1e19/cm³. The first block region 302 is within the first layer 114. In particular, the first block region 302 encompasses at least a portion of the recess structure 107. The second block region 304 may be doped with dopants of the second conductivity type, e.g., n type. In some embodiments, the dopant concentration of the second block region 304 may be at a level of about 1e16/cm³ to about 1e18/cm³. The second block region 304 is within the first layer 114. In particular, the second block region 304 is between the first block region 302 and the second layer 102, and the second block region 304 encompasses at least a portion of the recess structure 107. Please note that the first block region 302 and the second block region 304 may be optionally omitted as the SPAD image sensor 100 of the first embodiment of the present disclosure.

Figure 7:
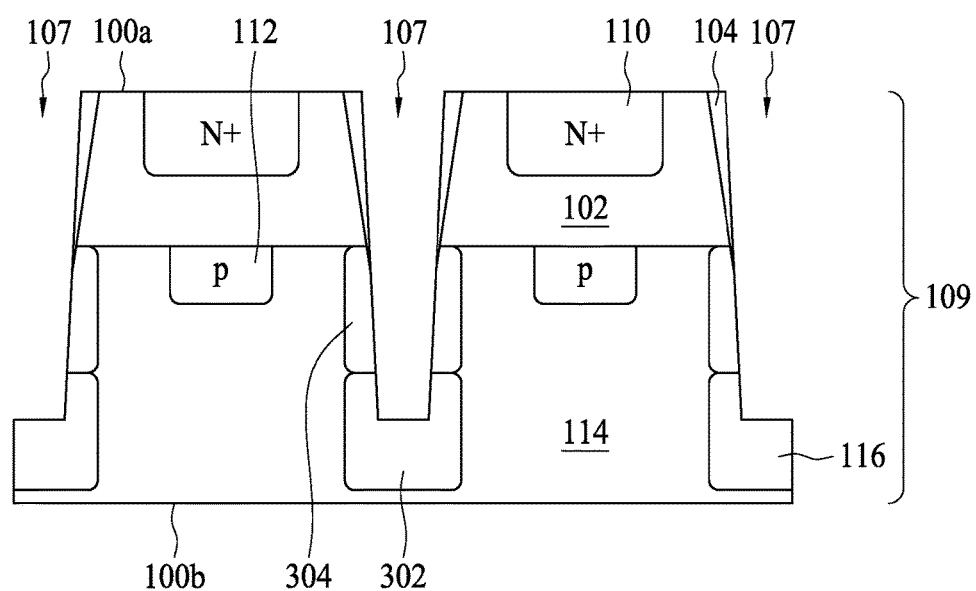

With reference to FIG. 7, an etching process may be performed to obtain recess structures 107 at the front surface 100a. In particular, the recess structures 107 respectively pass through the bottom surface 404a of the isolation structures 404, and further pass through the second block region 304 and extend to the first block region 302. For many instances, a portion of the isolation structures 404 may be intentionally remained without being etched away, and the remaining portions may be referred to as the outer spacer 104. The outer spacer 104 may be able to protect the sensing node 110 or other implant region in the substrate 109 during the subsequent processes. In some embodiments, the etching process includes a dry etching process. An etching mask (for example a hard mask, not illustrated herein) may be formed before the etching process is performed to define the size and location of the recess structures 107. The recess structures 107 may be formed to respectively have a rectangular shape, somewhat a trapezoidal shape, or another suitable shape.

Figure 8:
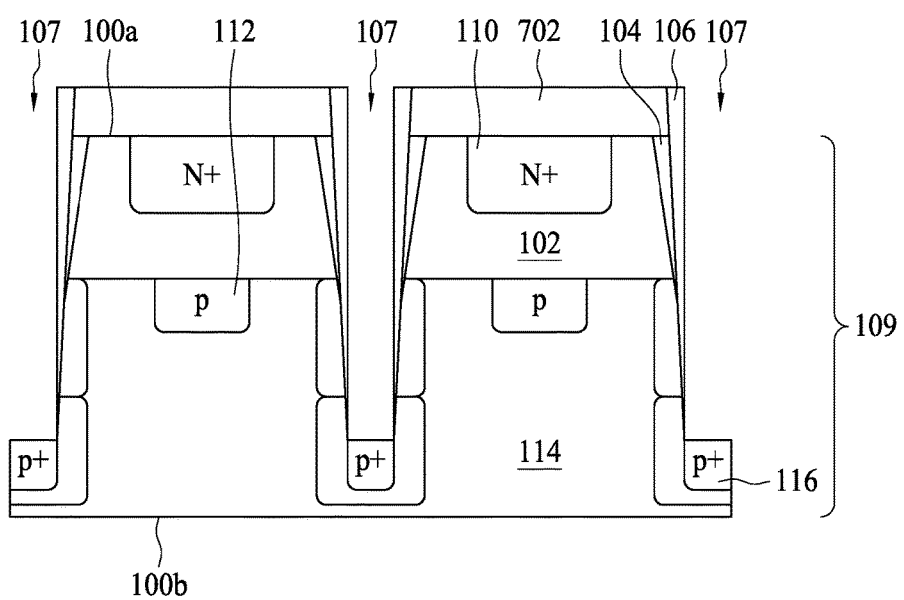

With reference to FIG. 8, a protection layer 702 may be deposited on the front surface 100a of the substrate to cover the exposed portion of the second layer 102 and the sensing node 110 at the surface 100a. In some embodiments, the protection layer 702 may be a dielectric material such as an oxide (silicon oxide, for example), a nitride (silicon nitride or silicon oxynitride, for example), a low-k dielectric, and/or another suitable dielectric material. In some embodiments, the protection layer 702 may be a hard mask formed from a material selected from the group consisting of silsesquioxane spin-on-glass (SOG) materials and amorphous carbon materials. In some embodiments, an inner spacer 106 may be optionally formed to cover sidewalls of the recess structures 107. In particular, the inner spacer 106 at least covers the portion of the substrate 109 exposed through the recess structures 107. The inner spacer 106 may be able to further protect the sensing node 110 or other implant region in the substrate 109 during the subsequent processes. In this way, the only exposed region of the substrate 109 is the bottom of the recess structures 107.

An ion implantation may be then performed upon the bottom of the recess structures 107 to generate the common node 116. The common node 116 may be heavily doped with dopants of the first conductivity type, e.g., p type, the same to the conductivity type of the first layer 114 and the third layer 112. A dopant concentration of the common node 116 may be heavier than the dopant concentration of the first layer 114 and the third layer 112.

Figure 9:
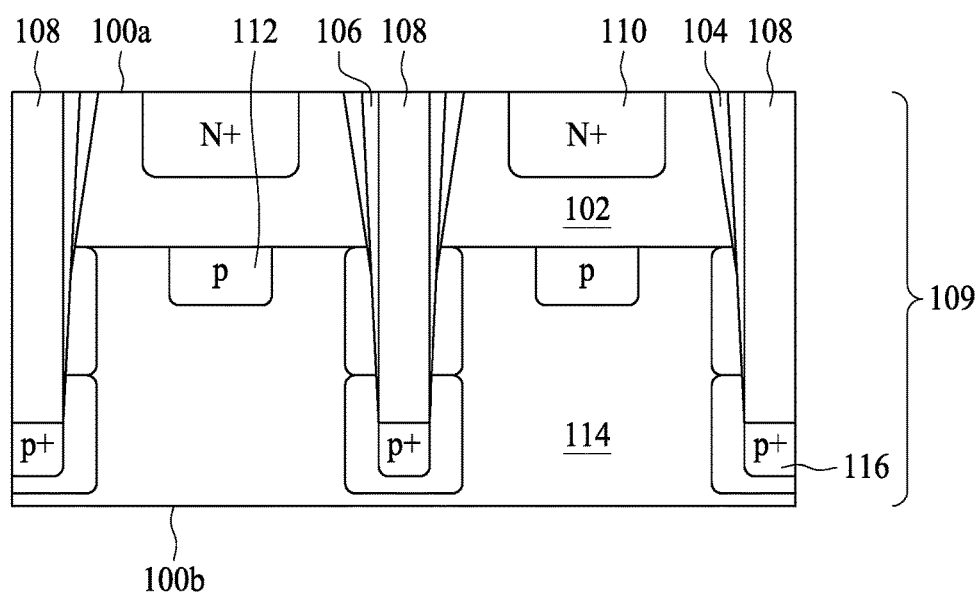

With reference to FIG. 9, the recess structures 107 are filled with a dielectric material 108 such as an oxide (silicon oxide, for example), a nitride (silicon nitride or silicon oxynitride, for example), a low-k dielectric, and/or another suitable dielectric material. Then a chemical mechanical polishing (CMP) may be performed to remove the protection layer 702 and a portion of the inner spacer 106 and the dielectric material 108 to expose the sensing node 110.

Figure 10:
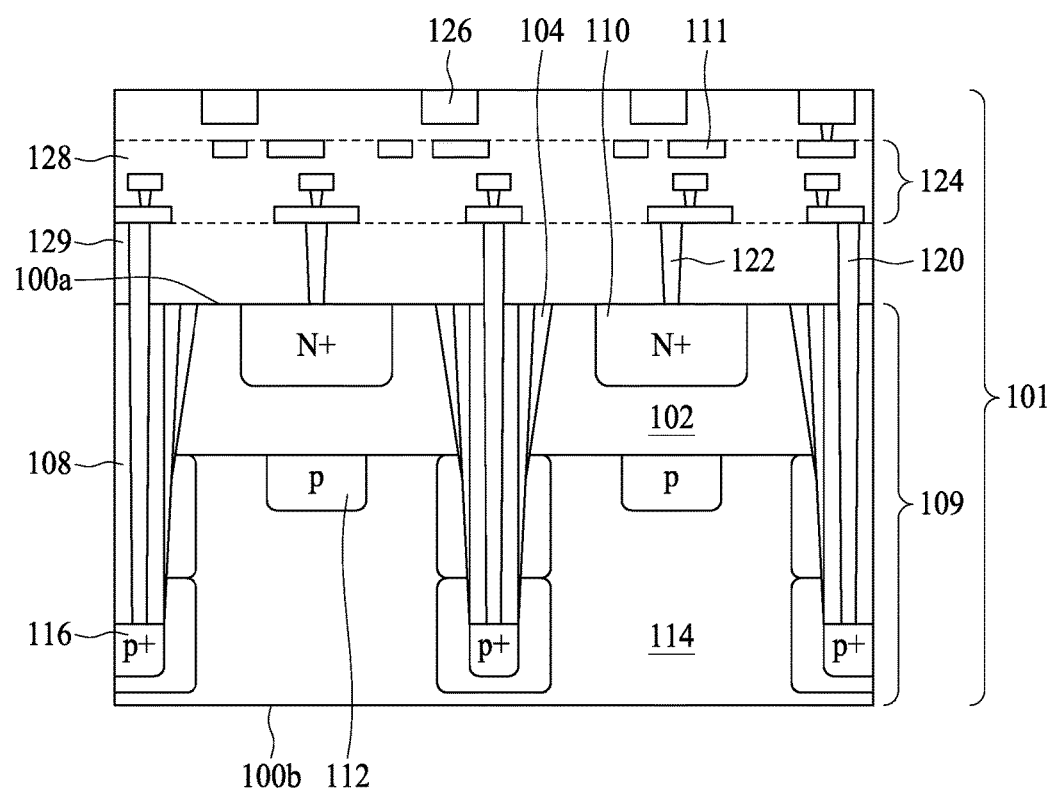

As shown in FIG. 10, contact plugs 120 and 122 are formed for the heavily doped common node 116 and sensing node 110. In some embodiments, the contact plugs 120 and 122 may be formed by forming a dielectric layer 129 over the front surface 100a of the substrate 109. The dielectric layer 129 is subsequently etched to form via holes and/or metal trenches. The via holes and/or metal trenches are then filled with a conductive material to form the contact plugs 122. In some embodiments, the contact plugs 120 and 122 may be comprised of tungsten, copper, or aluminium copper, for example. The interconnect structure 124 is formed over the substrate 109, forming the imaging chip 101. In some embodiments, the interconnect structure 124 may be formed by forming the ILD layer 128, which includes one or more layers of ILD material, over the dielectric layer 129. The ILD layer 128 is subsequently etched to form via holes and/or metal trenches. The via holes and/or metal trenches are then filled with a conductive material to form the plurality of metal layers 111. In some embodiments, the ILD layer 128 may be deposited by a physical vapor deposition technique (e.g., PVD, CVD, etc.). The plurality of metal layers 111 may be formed using a deposition process and/or a plating process (e.g., electroplating, electro-less plating, etc.). In various embodiments, the plurality of metal layers 111 may be comprised of tungsten, copper, or aluminum copper, for example. In some embodiments, a top metal layer 126 of the plurality of metal layers 111 has an upper surface aligned with an upper surface of the ILD layer 128.

Figure 11:
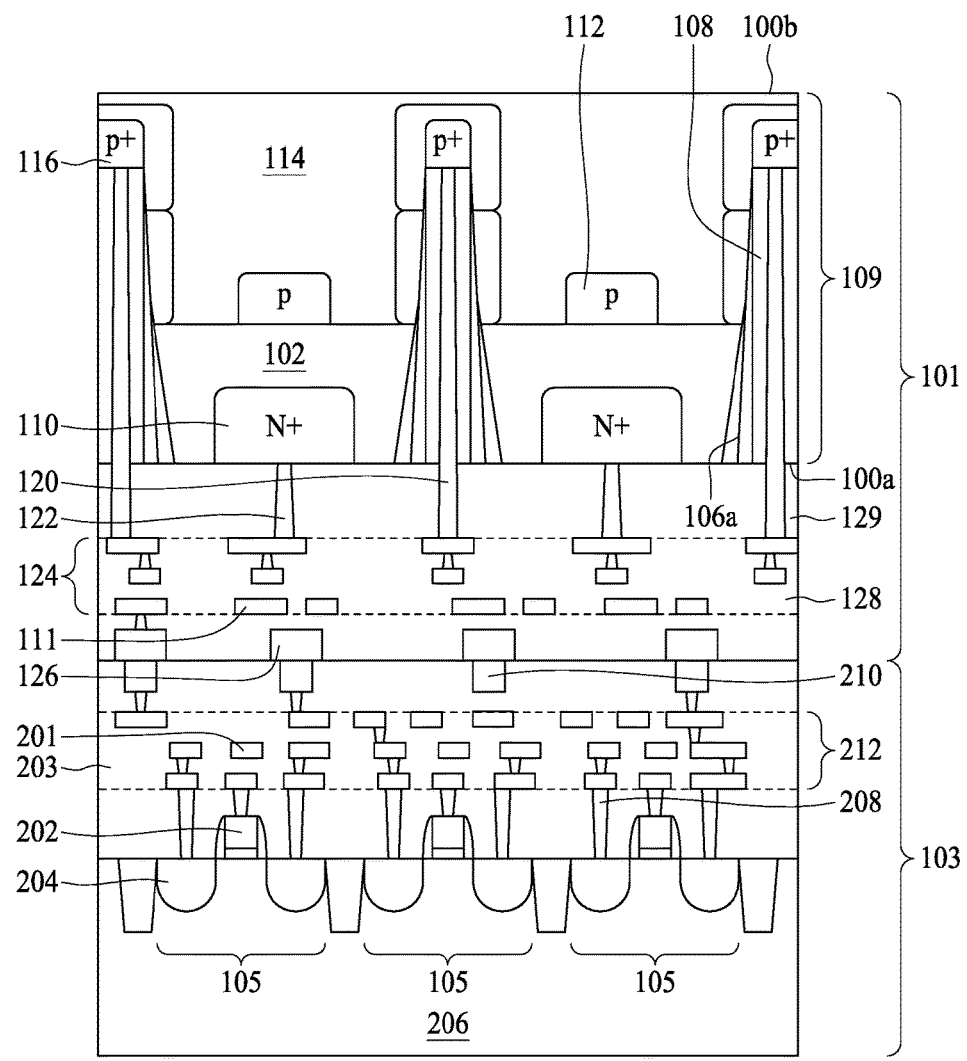

As shown in FIG. 11, the imaging chip 101 is bonded to the CMOS chip 103. The CMOS chip 103 includes the substrate 206. The active devices 105 are formed within the substrate 206. In various embodiments, the substrate 206 may include any type of semiconductor body (e.g., silicon/CMOS bulk, SiGe, SOI, etc.) such as a semiconductor wafer or one or more die on a wafer, as well as any other type of semiconductor and/or epitaxial layers formed thereon and/or otherwise associated therewith. In some embodiments, the active devices 105 may include transistors formed by depositing the gate structure 202 over the substrate 206 and forming the source/drain regions 204 by implantation or epitaxial growth. The interconnect structure 212 is formed over the substrate 206, to form the CMOS chip 103. In some embodiments, the interconnect structure 212 may be formed by forming the ILD layer 203, which includes one or more layers of ILD material, over the substrate 206. The ILD layer 203 is subsequently etched to form via holes and/or metal trenches. The via holes and/or metal trenches are then filled with a conductive material to form the plurality of metal layers 201. In some embodiments, the ILD layer 203 may be deposited by a physical vapor deposition technique (e.g., PVD, CVD, etc.). The metal layers 201 may be formed using a deposition process and/or a plating process (e.g., electro-plating, electro-less plating, etc.). In various embodiments, the plurality of metal layers 201 may be comprised of tungsten, copper, or aluminum copper, for example. In some embodiments, the top metal layer 210 of the plurality of metal layers 201 has an upper surface aligned with an upper surface of the ILD layer 203.

In some embodiments, the bonding process may form a hybrid bond including a metal-to-metal bond and a dielectric-to-dielectric bond. The top metal layer 210 and the top metal layer 126 can be bonded together in direct. The ILD layer 128 and the ILD layer 203 can abut one another to define a dielectric-to-dielectric bond of the hybrid bond. In some embodiments, the dielectric-to-dielectric bond is an oxide-to-oxide bond. In some other embodiments, the bonding process may use an intermediate bonding oxide layer (not shown) arranged between the ILD layer 128 and the ILD layer 203.

Referring back to FIG. 2, the high-k dielectric layer 214 is formed over the back surface 100b of the substrate 109. An ARC layer 216 can be formed over the high-k dielectric layer 214. In some embodiments, the high-k dielectric layer 214 and the ARC layer 216 may be deposited using a physical vapor deposition technique. In some embodiments, a thickness of the bonded imaging chip 101 may be reduced before the high-k dielectric layer 214 is formed over the back surface 100b of the substrate 109. In some embodiments, the substrate 109 may be thinned by etching the back surface 100b of the substrate 109. In other embodiments, the substrate 109 may be thinned by mechanical grinding the back surface 100b of the substrate 109. In some embodiments, the substrate 109 may be thinned but not expose the epitaxial layer 108.

The color filters 217 can be formed over the back surface 100b of the substrate 109. In some embodiments, the color filters 217 may be formed by forming a color filter layer and patterning the color filter layer. The color filter layer is formed of a material that allows for the transmission of radiation (e.g., light) having a specific range of wavelength, while blocking light of wavelengths outside of the specified range. Further, in some embodiments, the color filter layer is planarized subsequent to formation. The micro-lenses 218 can also be formed over the color filters 217. In some embodiments, the micro-lenses 218 may be formed by depositing a micro-lens material above the plurality of color filters (e.g., by a spin-on method or a deposition process). A micro-lens template (not shown) having a curved upper surface is patterned above the micro-lens material. In some embodiments, the micro-lens template may include a photoresist material exposed using a distributing exposing light dose (e.g., for a negative photoresist more light is exposed at a bottom of the curvature and less light is exposed at a top of the curvature), developed and baked to form a rounding shape. The micro-lenses 218 are then formed by selectively etching the micro-lens material according to the micro-lens template.

Some embodiments of the present disclosure provide a single photon avalanche diode (SPAD) image sensor. The SPAD image sensor includes: a substrate having a front surface and a back surface; a trench isolation in the substrate, the trench isolation extending from the front surface of the substrate toward the back surface of the substrate, the trench isolation having a first surface and a second surface opposite to the first surface, the first surface being coplanar with the front surface of the substrate, the second surface being distanced from the back surface of the substrate by a distance greater than 0; wherein the substrate includes: a first layer doped with dopants of a first conductivity type, the first layer extending from the back surface of the substrate toward the trench isolation and laterally surrounding at least a portion of sidewalls of the trench isolation; a sensing node heavily doped with dopants of a second conductivity type opposite to the first conductivity type, the sensing node being within the substrate and abutting the front surface of the substrate; and a common node heavily doped with dopants of the first conductivity type, the common node being between the second surface of the trench isolation and the back surface of the substrate.

Some embodiments of the present disclosure provide a single photon avalanche diode (SPAD) image sensor. The SPAD image sensor includes: a substrate having a front surface and a back surface, the substrate including: a first layer doped with dopants of a first conductivity type, the first layer abutting the back surface of the substrate; a second layer doped with dopants of a second conductivity type opposite to the first conductivity type, the second layer abutting the front surface of the substrate; a third layer doped with dopants of the first conductivity type, the third layer being within the first layer and abutting the second layer; a sensing node doped with dopants of the second conductivity type, the sensing node being within the second layer; and a common node doped with dopants of the first conductivity type, the common node being within the first layer and distanced from the second layer by a distance greater than 0 with respect to a first direction perpendicular to a second direction of the front surface of the substrate, and the third layer being between the sensing node and the common node with respect to the first direction.

Some embodiments of the present disclosure provide a single photon avalanche diode (SPAD) image sensor. The SPAD image sensor includes: an array of pixels arranged in a substrate, the substrate having a front surface and a back surface, and each pixel including: a first layer doped with dopants of a first conductivity type, the first layer being within the substrate and abutting the back surface of the substrate; a second layer doped with dopants of a second conductivity type opposite to the first conductivity type, the second layer being within the substrate and between the front surface of the substrate and the first layer; a third layer doped with dopants of the first conductivity type, the third layer being within the first layer and abutting the second layer; a sensing node doped with dopants of the second conductivity type, the sensing node being within the second layer; and a common node doped with dopants of the first conductivity type, the common node being within the first layer and distanced from the second layer by a distance with respect to a first direction perpendicular to a second direction of the front surface of the substrate, and the third layer being between the sensing node and the common node in the first direction; and an isolator between adjacent common nodes corresponding to adjacent pixels of the array of pixels.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A single photon avalanche diode (SPAD) image sensor, comprising:
a substrate having a front surface and a back surface;
a trench isolation in the substrate, the trench isolation extending from the front surface of the substrate toward the back surface of the substrate, the trench isolation having a first surface and a second surface opposite to the first surface, the first surface being coplanar with the front surface of the substrate, the second surface being distanced from the back surface of the substrate by a distance greater than 0;
wherein the substrate includes:
a first layer doped with dopants of a first conductivity type, the first layer extending from the back surface of the substrate toward the trench isolation and laterally surrounding at least a portion of sidewalls of the trench isolation;
a sensing node heavily doped with dopants of a second conductivity type opposite to the first conductivity type, the sensing node being within the substrate and abutting the front surface of the substrate; and
a common node being more heavily doped than the first layer with dopants of the first conductivity type, the common node being between the second surface of the trench isolation and the back surface of the substrate.

2. The SPAD image sensor of claim 1, wherein the substrate further comprises:
a second layer doped with dopants of the second conductivity type, the second layer being between the front surface of the substrate and the first layer; and
a third layer doped with dopants of the first conductivity type, the third layer being within the first layer and abutting the second layer.

3. The SPAD image sensor of claim 2, wherein a distance between the common node and the second layer is in a range from about 0.5 um to about 1 um.

4. The SPAD image sensor of claim 2, wherein a ratio of a dopant concentration of the sensing node to a dopant concentration of the second layer is in a range from about 10 to about 1000.

5. The SPAD image sensor of claim 2, wherein a ratio of a dopant concentration of the third layer to a dopant concentration of the first layer is in a range from about 1 to about 100.

6. The SPAD image sensor of claim 2, wherein a ratio of a dopant concentration of the common node to a dopant concentration of the third layer is in a range from about 10 to about 1000.

7. The SPAD image sensor of claim 1, wherein the substrate further includes a first block region within the first layer, the first block region abutting and encompassing the common node.

8. The SPAD image sensor of claim 7, wherein a ratio of a dopant concentration of the common node to a dopant concentration of the first block region is in a range from about 10 to about 100.

9. The SPAD image sensor of claim 2, wherein the substrate further includes a second block region within the first layer, the first block region abutting and encompassing a portion of the trench isolation.

10. The SPAD image sensor of claim 9, wherein a ratio of a dopant concentration of the second layer to a dopant concentration of the second block region may be in a range from about 10 to about 100.

11. A single photon avalanche diode (SPAD) image sensor, comprising:
a substrate having a front surface and a back surface, the substrate including:
a first layer doped with dopants of a first conductivity type, the first layer abutting the back surface of the substrate;
a second layer doped with dopants of a second conductivity type opposite to the first conductivity type, the second layer abutting the front surface of the substrate;
a third layer doped with dopants of the first conductivity type, the third layer being within the first layer and abutting the second layer;
a sensing node doped with dopants of the second conductivity type, the sensing node being within the second layer; and
a common node doped with dopants of the first conductivity type, the common node being within the first layer and distanced from the second layer by a distance greater than 0 with respect to a first direction perpendicular to a second direction of the front surface of the substrate, and the third layer being between the sensing node and the common node with respect to the first direction.

12. The SPAD image sensor of claim 11, further comprising a trench isolation extending from the front surface of the substrate toward the back surface of the substrate, the trench isolation having a first surface and a second surface opposite to the first surface, the first surface being coplanar with the front surface of the substrate, the second surface being distanced from the back surface of the substrate by a distance greater than 0.

13. The SPAD image sensor of claim 12, wherein the trench isolation includes a main structure and an inner spacer, the main structure having a rectangular profile, and the inner spacer having a right triangular profile including a hypotenuse, a first leg and a second leg longer than the first leg; wherein:
the first leg of the inner spacer is coplanar with the front surface of the substrate, and the second leg of the inner spacer abuts a sidewall of the main structure.

14. The SPAD image sensor of claim 13, wherein the trench isolation further includes an outer spacer having a right triangular profile including a hypotenuse, a first leg and a second leg longer than the first leg; wherein:
the first leg of the outer spacer is coplanar with the front surface of the substrate, and the second leg of the outer spacer abuts the hypotenuse of the inner spacer, and a length of the second leg of the outer spacer is shorter than a length of the hypotenuse of the inner spacer.

15. The SPAD image sensor of claim 11, further comprising a first inter-layer dielectric (ILD) layer at the front surface of the substrate, the first ILD layer including a plurality of metal layers.

16. The SPAD image sensor of claim 15, further comprising a chip, the chip including a plurality of active devices and a second ILD layer bonded to the first ILD layer.

17. The SPAD image sensor of claim 11, further comprising a lens at the back surface of the substrate.

18. A single photon avalanche diode (SPAD) image sensor, comprising:
an array of pixels arranged in a substrate, the substrate having a front surface and a back surface, and each pixel including:
a first layer doped with dopants of a first conductivity type, the first layer being within the substrate and abutting the back surface of the substrate;
a second layer doped with dopants of a second conductivity type opposite to the first conductivity type, the second layer being within the substrate and between the front surface of the substrate and the first layer;
a third layer doped with dopants of the first conductivity type, the third layer being within the first layer and abutting the second layer;
a sensing node doped with dopants of the second conductivity type, the sensing node being within the second layer; and
a common node doped with dopants of the first conductivity type, the common node being within the first layer and distanced from the second layer by a distance with respect to a first direction perpendicular to a second direction of the front surface of the substrate, and the third layer being between the sensing node and the common node in the first direction; and
an isolator between adjacent common nodes corresponding to adjacent pixels of the array of pixels.

19. The SPAD image sensor of claim 18, wherein the distance between the common node and the second layer with respect to the first direction is in a range from about 0.5 um to about 1 um.

20. The SPAD image sensor of claim 18, wherein the first conductivity type is n type and the second conductivity type is p type.

* * * * *